(12) United States Patent
Higashihata

(10) Patent No.: US 12,267,955 B2
(45) Date of Patent: Apr. 1, 2025

(54) SEMICONDUCTOR DEVICE, POWER CONVERSION APPARATUS, MOVING BODY, AND METHOD FOR PRODUCING SEMICONDUCTOR DEVICE

(71) Applicant: Mitsubishi Electric Corporation, Tokyo (JP)

(72) Inventor: Takeshi Higashihata, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 368 days.

(21) Appl. No.: 17/906,695

(22) PCT Filed: May 21, 2020

(86) PCT No.: PCT/JP2020/020057
§ 371 (c)(1),
(2) Date: Sep. 19, 2022

(87) PCT Pub. No.: WO2021/234892
PCT Pub. Date: Nov. 25, 2021

(65) Prior Publication Data
US 2023/0164915 A1 May 25, 2023

(51) Int. Cl.
*H05K 1/11* (2006.01)
*B60R 16/02* (2006.01)
(Continued)

(52) U.S. Cl.
CPC ............. *H05K 1/111* (2013.01); *B60R 16/02* (2013.01); *H02M 7/003* (2013.01); *H05K 1/181* (2013.01);
(Continued)

(58) Field of Classification Search
CPC ...... H05K 1/111; H05K 1/181; H05K 3/3442; H05K 3/3478; H05K 2201/09472; H05K 2201/10636; H02M 7/003
See application file for complete search history.

(56) References Cited

U.S. PATENT DOCUMENTS 6,316,736 B1 * 11/2001 Jairazbhoy ............. H05K 1/111
174/250
2007/0108257 A1 * 5/2007 Liao ...................... H05K 3/3442
228/180.21
(Continued)

FOREIGN PATENT DOCUMENTS

CN 205319148 U 6/2016
CN 110828410 A 2/2020
(Continued)

OTHER PUBLICATIONS

An Office Action; "Notice of Reasons for Refusal," mailed by the Japanese Patent Office on Sep. 27, 2022, which corresponds to Japanese Patent Application No. 2022-524789 and is related to U.S. Appl. No. 17/906,695; with English language translation.
(Continued)

*Primary Examiner* — Nathan Milakovich
(74) *Attorney, Agent, or Firm* — Studebaker Brackett PLLC

(57) ABSTRACT

An object of the present invention is to provide a technique capable of suppressing displacement of an electronic component and a solder ball without using a jig. A semiconductor device includes an insulating substrate, an electronic component, and solder. A metal pattern and a semiconductor element are disposed on the insulating substrate. The metal pattern has a first recess and a second recess that are provided side by side. A part of the electronic component is disposed in the first recess. The solder connects the metal (Continued)

pattern disposed on the insulating substrate and the electronic component.

8 Claims, 6 Drawing Sheets

(51) Int. Cl.
*H02M 7/00* (2006.01)
*H05K 1/18* (2006.01)
*H05K 3/34* (2006.01)

(52) U.S. Cl.
CPC ......... *H05K 3/3442* (2013.01); *H05K 3/3478* (2013.01); *H05K 2201/09472* (2013.01); *H05K 2201/10636* (2013.01)

(56) References Cited

U.S. PATENT DOCUMENTS

| | | | | |
|---|---|---|---|---|
| 2011/0284278 A1* | 11/2011 | Hine | ....................... | H05K 1/111 |
| | | | | 174/260 |
| 2017/0150605 A1* | 5/2017 | Nagai | ..................... | H05K 1/111 |
| 2017/0263516 A1 | 9/2017 | Ishimaru et al. | | |
| 2020/0052449 A1 | 2/2020 | Takewaki et al. | | |
| 2020/0315016 A1* | 10/2020 | Tsuboi | ................... | H05K 1/181 |

FOREIGN PATENT DOCUMENTS

| | | |
|---|---|---|
| JP | H11-330146 A | 11/1999 |
| JP | H11-345969 A | 12/1999 |
| JP | 2001-237338 A | 8/2001 |
| JP | 2016-058594 A | 4/2016 |
| JP | 2017092270 A * | 5/2017 |

OTHER PUBLICATIONS

An Office Action; mailed by The State Intellectual Property Office of People's Republic of China on Sep. 24, 2024, which corresponds to Chinese Patent Application No. 202080101002.3 and is related to U.S. Appl. No. 17/906,695.

International Search Report issued in PCT/JP2020/020057; mailed Aug. 11, 2020.

* cited by examiner

FIG. 1     < RELATED ART >
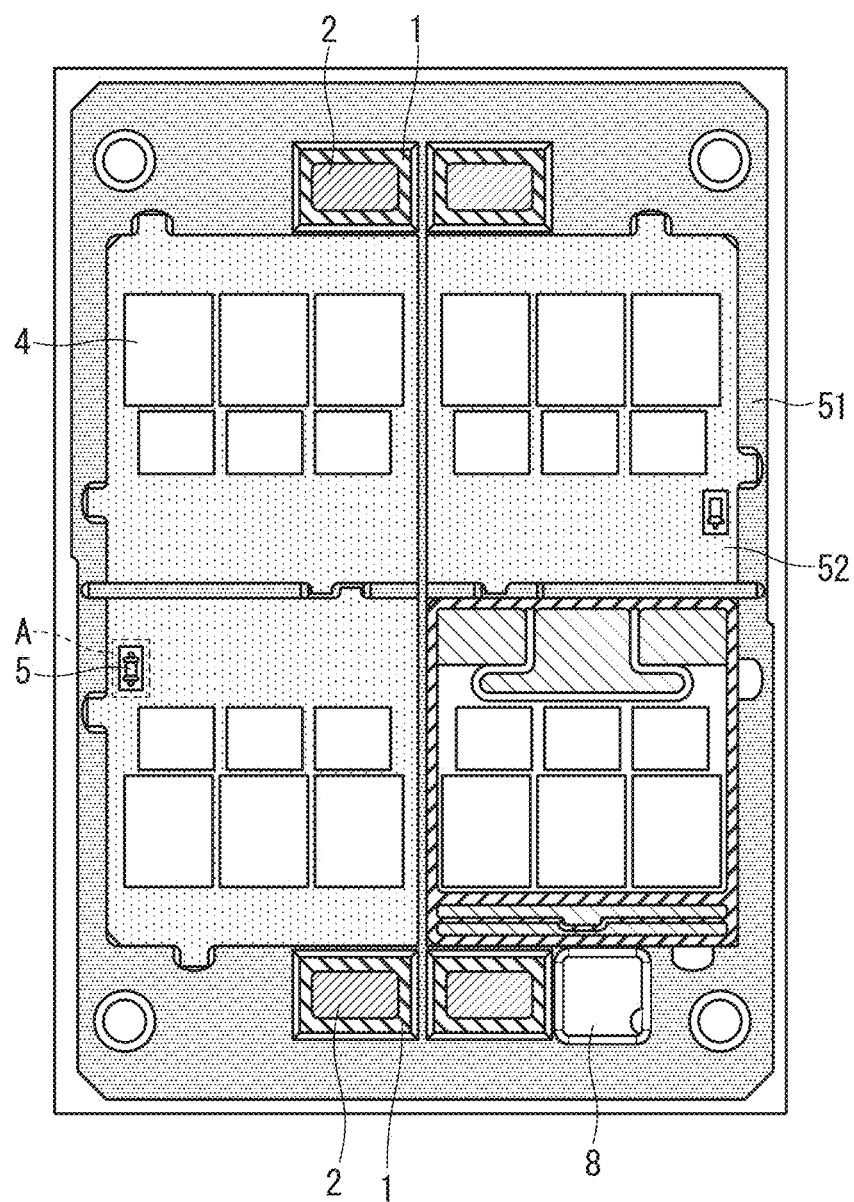

FIG. 2 < RELATED ART >
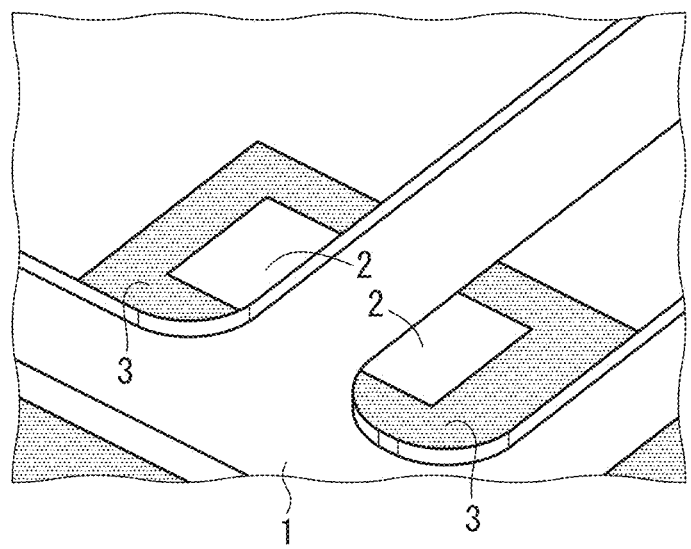
FIG. 3 < RELATED ART >
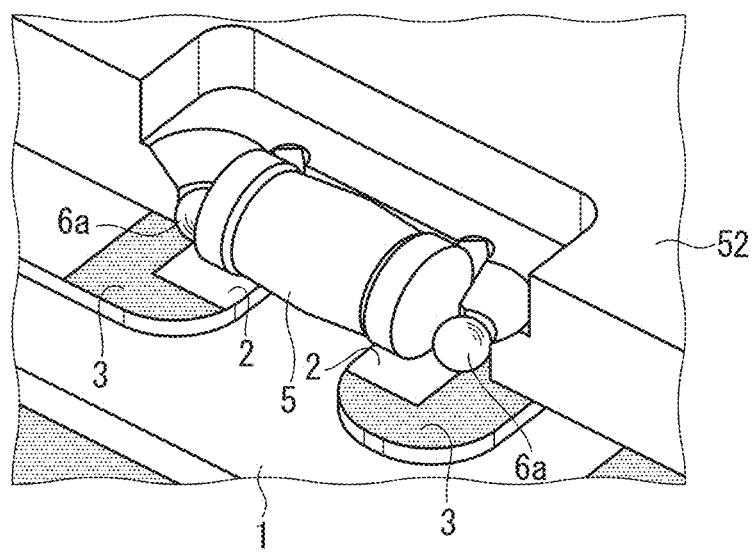

FIG. 4    < RELATED ART >
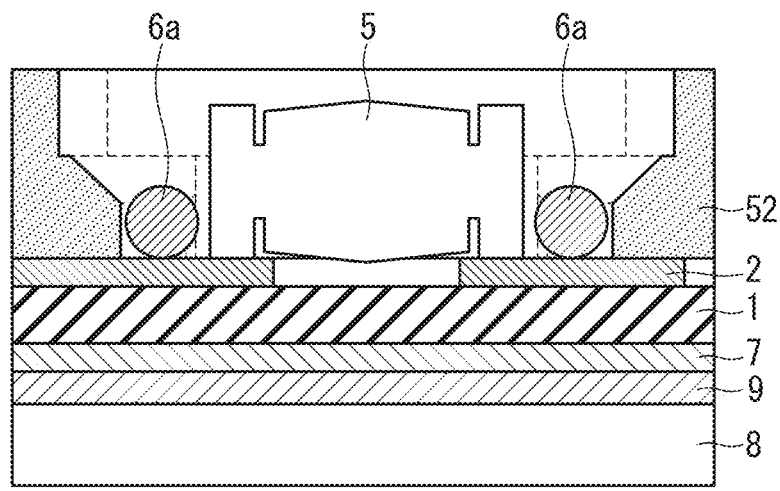
FIG. 5
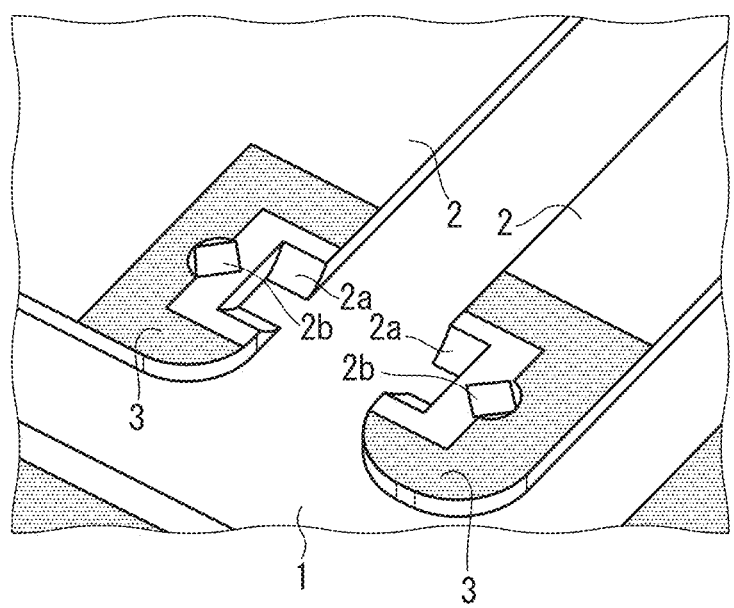

SEMICONDUCTOR DEVICE, POWER CONVERSION APPARATUS, MOVING BODY, AND METHOD FOR PRODUCING SEMICONDUCTOR DEVICE

TECHNICAL FIELD

The present disclosure relates to a semiconductor device, a power conversion apparatus, a moving body, and a method of producing a semiconductor device.

BACKGROUND ART

In a production process of a semiconductor device, in some cases, an electronic component is electrically connected to a metal pattern disposed on an insulating substrate after the electronic component is aligned with the metal pattern. However, before the metal pattern and the electronic component are connected, the electronic component may move in an in-plane direction of an insulating substrate, for example, due to transportation of the insulating substrate, and displacement of the electronic component may occur. In this case, there is a problem that the electronic component needs to be aligned again.

In order to solve such a problem, Patent Document 1 proposes a technique for regulating movement of an electronic component by a side wall of a thick metal pattern.

PRIOR ART DOCUMENT

Patent Document

Patent Document 1: Japanese Patent Application Laid-Open No. 11-345969 (1999)

SUMMARY

Problem to be Solved by the Invention

In recent years, it has been proposed to use, as a bonding member for electrically connecting a metal pattern and an electronic component, a solder ball whose quantity of use is easy to manage. However, since a spherical solder ball is easy to roll, use of a solder ball in a configuration of a conventional technique may cause displacement of the solder ball before the solder ball melts. Therefore, there is a problem that a jig for suppressing displacement of the solder ball is required.

The present disclosure has been made in view of the above problems, and an object of the present disclosure is to provide a technique capable of suppressing displacement of an electronic component and a solder ball without using a jig.

Means to Solve the Problem

A semiconductor device according to the present disclosure includes: an insulating substrate on which a metal pattern having a first recess and a second recess that are provided side by side and a semiconductor element are disposed; an electronic component partially disposed in the first recess; and solder that connects the metal pattern and the electronic component.

Effects of the Invention

According to the present disclosure, since the metal pattern has the first recess and the second recess, displace-ment of the electronic component and the solder ball can be suppressed without using a jig.

Objects, features, aspects, and advantages of the present disclosure will become more apparent from the following detailed description and the accompanying drawings.

BRIEF DESCRIPTION OF DRAWINGS

FIG. 1 is a plan view for explaining a production process of a related semiconductor device.

FIG. 2 is a cross-sectional perspective view for explaining the production process of the related semiconductor device.

FIG. 3 is a cross-sectional perspective view for explaining the production process of the related semiconductor device.

FIG. 4 is a cross-sectional view for explaining the production process of the related semiconductor device.

FIG. 5 is a cross-sectional perspective view for explaining a production process of a semiconductor device according to a first embodiment.

DESCRIPTION OF EMBODIMENTS

Figure 6:
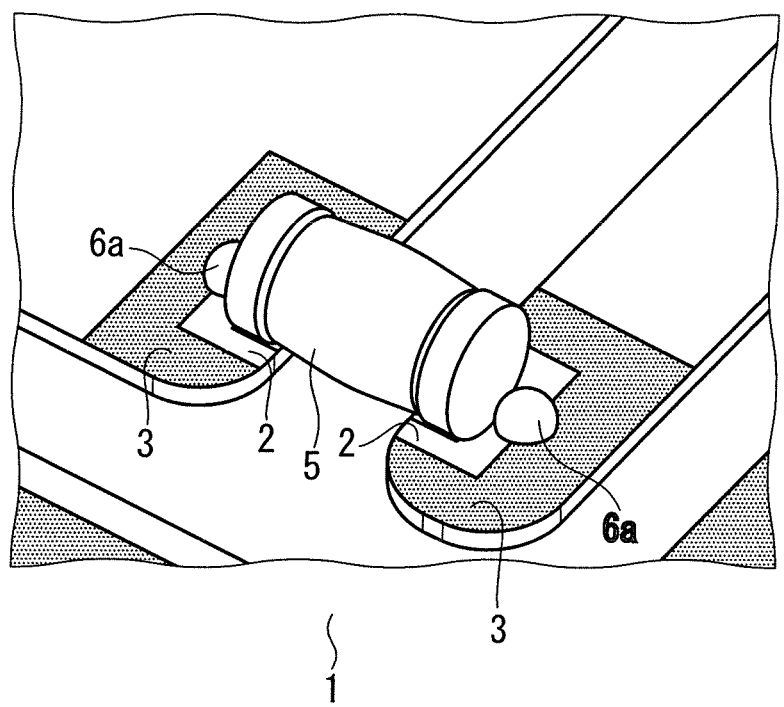
FIG. 6 is a cross-sectional perspective view for explaining the production process of the semiconductor device according to the first embodiment.

Hereinafter, embodiments will be described with reference to the accompanying drawings Features described in the following embodiments are examples, and not all features are essential. In the following description, similar constituent elements in a plurality of embodiments are given identical or similar reference signs, and different constituent elements will be mainly described. In addition, in the following description, specific positions and directions such as "upper", "lower", "left", "right", "front", and "back" may not necessarily coincide with directions in actual implementation.

<Related Semiconductor Device>

First, before describing a semiconductor device according to a first embodiment, a production process of a semiconductor device (hereinafter referred to as a "related semiconductor device") related to the semiconductor device according to the first embodiment will be described. Note that the related semiconductor device is, for example, a power semiconductor device.

FIG. 1 is a plan view for explaining a positioning step in a production process of the related semiconductor device. FIG. 2 is a cross-sectional perspective view of a portion indicated by dotted frame A in FIG. 1 before the positioning step.

Before the positioning step of the related semiconductor device is performed, an insulating substrate 1 on which a metal pattern 2 is disposed as illustrated in FIG. 2 is prepared. The metal pattern 2 has two portions separated from each other, and two solder resists 3 are disposed on the two portions, respectively. The solder resists 3 have a U-shape whose openings face each other as a planar shape.

Here, an upper portion of the metal pattern 2 is substantially flat, and a solder ball used as a bonding member of the metal pattern 2 has a spherical shape. For this reason, even in a case where the solder ball is placed at a designed position on the metal pattern 2 where the solder ball is to be melted, the solder ball may be displaced from the designed position when the insulating substrate 1 is transported to a reflow apparatus for melting the solder ball.

In view of this, in the positioning step of the related semiconductor device, the insulating substrate 1 and a first jig 51 for positioning the insulating substrate 1 are sequentially placed on a base plate 8 such as a heat sink in FIG. 1, and then a second jig 52 is fitted into a hole of the first jig 51. Thereafter, a semiconductor chip 4, which is a semiconductor element, an electronic component 5, and a spherical solder ball are fitted into a hole of the second jig 52.

FIG. 3 is a cross-sectional perspective view of the portion indicated by dotted frame A in FIG. 1 after the fitting is performed, and FIG. 4 is a cross-sectional view of FIG. 3. Note that a metal pattern 7 and a bonding member 9 are illustrated in FIG. 4. The metal pattern 7 is disposed on a surface of the insulating substrate 1 opposite to a surface on which the metal pattern 2 is disposed. The bonding member 9 is, for example, solder, and is disposed between the metal pattern 7 and the base plate 8.

As illustrated in FIG. 3, both ends of the electronic component 5 are placed on the metal pattern 2 so as to be located inside the U-shapes of the two solder resists 3. As illustrated in FIGS. 3 and 4, two solder balls 6a are placed on portions of the metal pattern 2 that are close to both ends of the electronic component 5.

As illustrated in FIGS. 3 and 4, the second jig 52 is present around the electronic component 5 and the solder balls 6a. Accordingly, movement of the cylindrical electronic component 5 and the spherical solder balls 6a in an in-plane direction of the insulating substrate 1 is restricted by the second jig 52.

In the production process of the related semiconductor device, after the positioning step, transporting the insulating substrate 1 to a reflow apparatus and a reflow step of melting the solder balls 6a is performed. In this way, solder that electrically connects both ends of the electronic component 5 and the two portions of the metal pattern 2 is formed from the solder balls 6a. As a result, the two portions of the metal pattern 2 are electrically connected with the electronic component 5 interposed therebetween.

Although not illustrated, in this reflow step, the semiconductor chip 4 is also electrically connected to the metal pattern 2 and others by a bonding member such as solder. Thereafter, the first jig 51 and the second jig 52 are removed from the insulating substrate 1.

According to the production process of the related semiconductor device described above, displacement of the electronic component 5 and the solder balls 6a can be suppressed to some extent. However, in the production process of the related semiconductor device, there is a problem that the second jig 52 for the dedicated purpose is required. In addition, there is a problem that the electronic component 5 and the solder balls 6a are displaced by an amount corresponding to a clearance between the second jig 52, the first jig 51, and the insulating substrate 1. On the other hand, in the embodiments of the present disclosure described below, such problems can be solved.

First Embodiment

Figure 7:
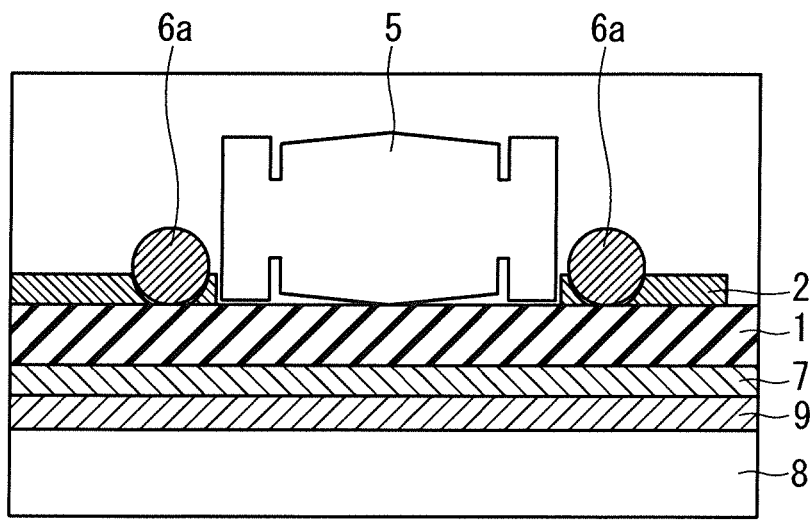
FIG. 7 is a cross-sectional view for explaining the production process of the semiconductor device according to the first embodiment.

FIGS. 5 and 6 are cross-sectional perspective views for explaining a production process of a semiconductor device according to the first embodiment, and FIG. 7 is a cross-sectional view of FIG. 6. FIGS. 5 to 7 correspond to FIGS. 2 to 4, respectively. Hereinafter, among the constituent elements according to the first embodiment, constituent elements identical or similar to the constituent elements described above will be given identical or similar reference signs, and different constituent elements will be mainly described.

Before a positioning step of the semiconductor device according to the first embodiment, an insulating substrate 1 on which a metal pattern 2 having a first recess 2a and a second recess 2b is disposed as illustrated in FIG. 5 is prepared. The first recess 2a is formed at a designed position of the electronic component 5, for example, by etching of the metal pattern 2. The second recess 2b is formed at a designed position of a solder ball 6a, for example, by etching of the metal pattern 2, and is provided side by side with the first recess 2a.

As illustrated in FIG. 7, in the first embodiment, inner walls of the first recess 2a and the second recess 2b are inclined, and the first recess 2a and the second recess 2b have cross-sectional shapes expanding toward an opening of the first recess 2a and an opening of the second recess 2b, respectively. As illustrated in FIG. 5, in the first embodiment, the first recess 2a and the second recess 2b are separated from each other.

In the example of FIG. 5, an opening shape of the first recess 2a in plan view is a U-shape, but is not limited to this. In the example of FIG. 5, an opening shape of the second recess 2b in plan view is a quadrangular shape, but is not limited to this and may be, for example, a circular shape.

A solder resist 3 is disposed on the metal pattern 2 and has a planar shape surrounding the first recess 2a and the second recess 2b. In the example of FIG. 5, the solder resist 3 has a U-shaped planar shape surrounding the first recess 2a and the second recess 2b, but the planar shape of the solder resist 3 is not limited to this.

As illustrated in FIGS. 6 and 7, a part of the electronic component 5 is fitted into the first recess 2a, and a part of the solder ball 6a is fitted into the second recess 2b. As a result, displacement of the cylindrical electronic component 5 is suppressed by the inner wall of the first recess 2a, and displacement of the spherical solder ball 6a is suppressed by the inner wall of the second recess 2b.

Thereafter, the insulating substrate 1 is transported to a reflow apparatus, and a reflow step of melting the solder ball 6a is performed. By this melting, solder for connecting the metal pattern 2 and the electronic component 5 is formed.

Note that a semiconductor chip 4 is disposed on the insulating substrate 1 before, after, or between the positioning step and the reflow step described above. For example, the semiconductor chip 4 is electrically connected to the metal pattern 2 and eventually the electronic component 5 by a bonding member such as solder.

Figure 8:
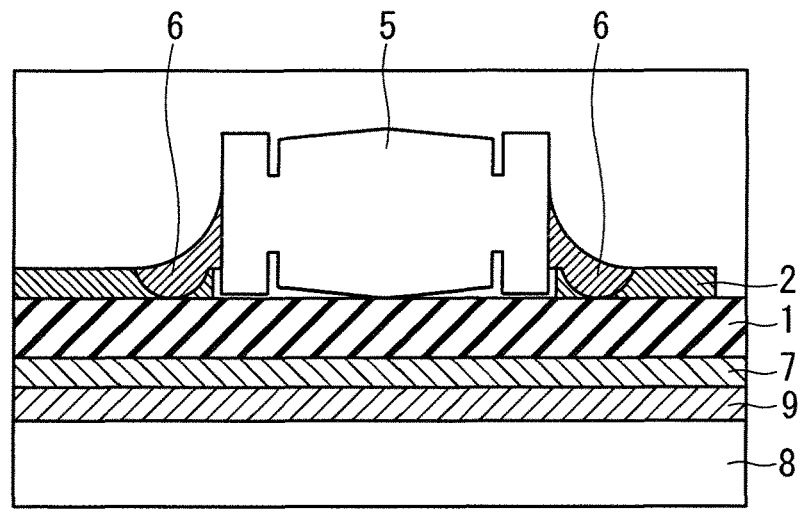
FIG. 8 is a cross-sectional view illustrating a configuration of the semiconductor device according to the first embodiment.

FIG. 8 is a cross-sectional view illustrating the semiconductor device after the reflow step according to the first embodiment, and corresponds to FIG. 7. As described above, the semiconductor device of FIG. 8 includes the insulating substrate 1 on which the metal pattern 2 having the first recess 2a and the second recess 2b is disposed, and the electronic component 5 partially disposed in the first recess 2a. The semiconductor device of FIG. 8 includes solder 6 formed by melting the solder ball 6a.

The solder 6 electrically connects both ends of the electronic component 5 and the two portions of the metal pattern 2. In the first embodiment, a part of the solder 6 is provided in the second recess 2b. According to such a configuration, a contact area between the solder 6 and the metal pattern 2 can be increased, and it is therefore possible to suppress peeling of the solder 6 from the metal pattern 2 and to increase reliability of the semiconductor device.

Furthermore, as described above, in the first embodiment, the first recess 2a and the second recess 2b have cross-sectional shapes expanding toward the opening of the first recess 2a and the opening of the second recess 2b, respectively. According to such a configuration, it is possible to suppress positional deviation and inclination of the electronic component 5 and the solder ball 6a before the reflow step, and it is therefore possible to enhance bondability of the solder 6. In addition, since the inner wall of the second recess 2b is inclined, the solder that is melting can easily flow to the electronic component 5 along the inner wall. As a result, the bondability of the solder 6 can be enhanced, and therefore the reliability of the semiconductor device can be increased.

In the first embodiment, as described above, the solder resist 3 has a planar shape surrounding the first recess 2a and the second recess 2b. According to such a configuration, a wetting area of the solder that is melting can be limited, and therefore the solder can easily flow to the electronic component 5. As a result, the shape and thickness of fillet can be secured, and it is therefore possible to enhance the bondability of the solder 6 and to increase the reliability of the semiconductor device.

If the first recess 2a and the second recess 2b are not separated from each other, it is assumed that the solder that is melting flows from the second recess 2b to a space under the electronic component 5 along the first recess 2a in some cases. In this case, it is assumed that the two separated portions of the metal pattern 2 are connected by the solder and a short circuit occurs in some cases. On the other hand, in the first embodiment, since the first recess 2a and the second recess 2b are separated from each other as described above, such a short circuit can be suppressed.

Second Embodiment

A power converter according to the second embodiment includes a main conversion circuit including the semiconductor device according to the first embodiment. A case where the semiconductor device according to the first embodiment is applied to a three-phase inverter will be described below as the second embodiment although the semiconductor device described above is not limited to a specific power conversion apparatus.

Figure 9:
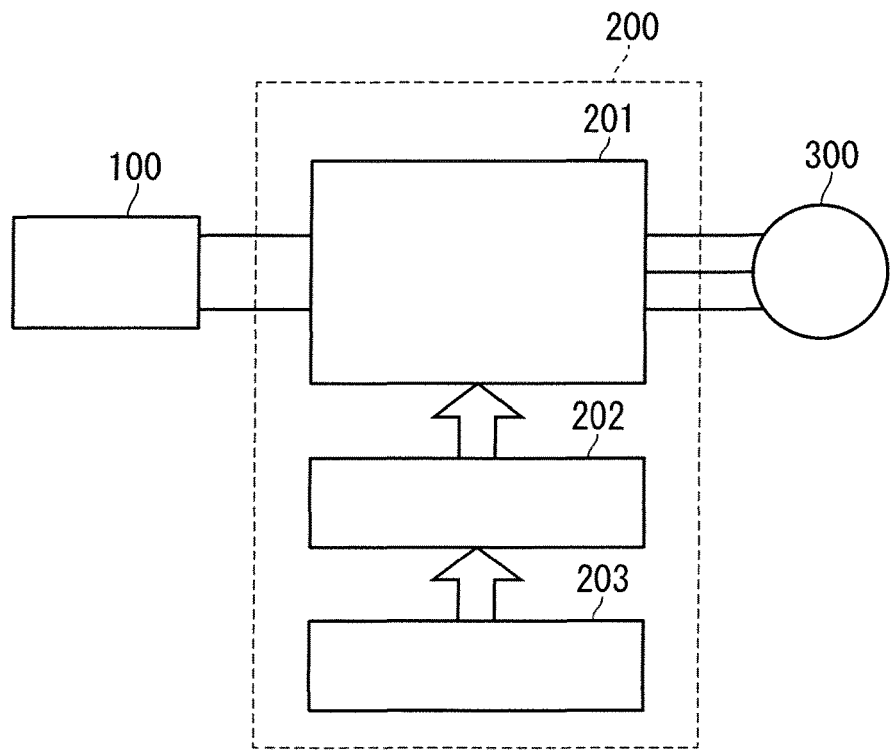
FIG. 9 is a block diagram illustrating a power conversion apparatus according to a second embodiment.

FIG. 9 is a block diagram illustrating a configuration of a power conversion system to which the power conversion apparatus according to the second embodiment is applied.

The power conversion system illustrated in FIG. 9 includes a power supply 100, a power conversion apparatus 200, and a load 300. The power supply 100 is a DC power supply, and supplies DC power to the power conversion apparatus 200. The power supply 100 can be any of various power supplies, and may be, for example, a DC system, a solar cell, or a rechargeable battery or may be a rectifier circuit or an AC/DC converter connected to an AC system. Alternatively, the power supply 100 may be a DC/DC converter that converts DC power output from a DC system into predetermined power.

The power conversion apparatus 200 is a three-phase inverter connected between the power supply 100 and the load 300, converts DC power supplied from the power supply 100 into AC power, and supplies the AC power to the load 300. As illustrated in FIG. 9, the power conversion apparatus 200 includes a main conversion circuit 201 that converts DC power into AC power and outputs the AC power, a drive circuit 202 that outputs a drive signal for driving each switching element of the main conversion circuit 201, and a control circuit 203 that outputs a control signal for controlling the drive circuit 202 to the drive circuit 202.

The load 300 is a three-phase electric motor driven by the AC power supplied from the power conversion apparatus 200. The load 300 is not limited to a specific application and is an electric motor mounted on various electric devices, and is, for example, used as an electric motor for a hybrid vehicle, an electric vehicle, a railway vehicle, an elevator, or an air conditioner.

Details of the power conversion apparatus 200 will be described below. The main conversion circuit 201 includes a switching element and a freewheeling diode (not illustrated), converts DC power supplied from the power supply 100 into AC power by switching of the switching element, and supplies the AC power to the load 300. Although various configurations are available as a specific circuit configuration of the main conversion circuit 201, the main conversion circuit 201 according to the second embodiment is a two-level three-phase full bridge circuit, and can include six switching elements and six freewheeling diodes connected in anti-parallel to the respective switching elements. Each switching element of the main conversion circuit 201 is the semiconductor device according to the first embodiment. Each two of the six switching elements are connected in series to constitute upper and lower arms, and the upper and lower arms constitute phases (a U-phase, a V-phase, a W-phase) of the full bridge circuit. Output terminals of the upper and lower arms, that is, three output terminals of the main conversion circuit 201 are connected to the load 300.

The drive circuit 202 generates a drive signal for driving the switching elements of the main conversion circuit 201, and supplies the drive signal to control electrodes of the switching elements of the main conversion circuit 201. Specifically, the drive circuit 202 outputs a drive signal for turning on the switching elements and a drive signal for turning off the switching elements to the control electrodes of the switching elements in accordance with a control signal from the control circuit 203, which will be described later. In a case where the switching elements are maintained in an ON state, the drive signal is a voltage signal (ON signal) equal to or higher than a threshold voltage of the switching elements, and in a case where the switching elements are maintained in an OFF state, the drive signal is a voltage signal (OFF signal) equal to or lower than the threshold voltage of the switching elements.

The control circuit 203 controls the switching elements of the main conversion circuit 201 so that desired power is supplied to the load 300. Specifically, the control circuit 203 calculates a time (ON time) for which each switching element of the main conversion circuit 201 is to be in an ON state based on the power to be supplied to the load 300. For example, the control circuit 203 can control the main conversion circuit 201 by pulse width modulation (PWM) control for modulating the ON time of the switching elements in accordance with a voltage to be output. Then, the control circuit 203 outputs a control command (control signal) to the drive circuit 202 so that an ON signal is output to a switching element to be in an ON state at each time point and an OFF signal is output to a switching element to be in an OFF state at each time point. The drive circuit 202 outputs an ON signal or an OFF signal as a drive signal to the control electrode of each switching element in accordance with the control signal.

In the power conversion apparatus according to the second embodiment described above, the semiconductor device according to the first embodiment is applied as the switching elements of the main conversion circuit 201, and it is therefore possible to realize a power conversion apparatus having increased reliability.

Although an example in which the semiconductor device according to the first embodiment is applied to the two-level three-phase inverter has been described in the second embodiment described above, the second embodiment is not limited to this, and the semiconductor device according to the first embodiment can be applied to various power conversion apparatuses. Although the semiconductor device according to the first embodiment is a two-level power conversion apparatus in the second embodiment, the semiconductor device according to the first embodiment may be a three-level or multi-level power conversion apparatus or the semiconductor device may be applied to a single-phase inverter in a case where power is supplied to a single-phase load. In a case where power is supplied to a DC load or the like, the semiconductor device can be applied to a DC/DC converter or an AC/DC converter.

Furthermore, the power conversion apparatus according to the second embodiment is not limited to the case where the load is an electric motor, and can be used as, for example, a power supply device of an electric discharge machine, a laser beam machine, an induction heating cooker, or a contactless power feeding system, and can also be used as a power conditioner of a solar power generation system, a power storage system, or the like.

Third Embodiment

Figure 10:
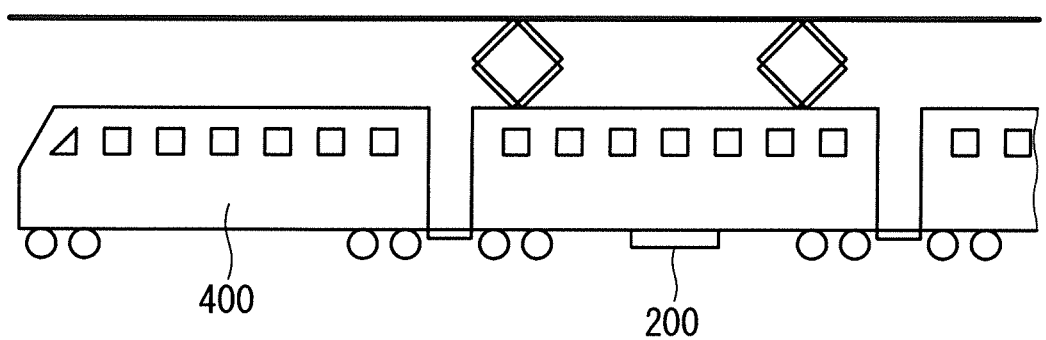
FIG. 10 is a block diagram illustrating a moving body according to a third embodiment.

FIG. 10 is a diagram illustrating a configuration of a moving body according to a third embodiment. The power conversion apparatus 200 according to the second embodiment is mounted on a moving body 400 illustrated in FIG. 10, and the moving body 400 is movable with an output from the power conversion apparatus 200. According to such a configuration, reliability of the moving body 400 can be increased. Although a case where the moving body 400 is a railway vehicle has been described, the moving body 400 is not limited to this, and may be, for example, a hybrid car, an electric car, an elevator, or the like.

The embodiments can be freely combined and changed or omitted as appropriate.

The above description is illustrative and not restrictive in all aspects. It is understood that numerous modifications not illustrated can be assumed.

EXPLANATION OF REFERENCE SIGNS

1: insulating substrate
2: metal pattern
2a: first recess
2b: second recess
3: solder resist
4: semiconductor chip
5: electronic component
6: solder
6a: solder ball

The invention claimed is:

1. A semiconductor device comprising:
an insulating substrate on which a metal pattern having a first recess and a second recess that are provided side by side and a semiconductor element are disposed;
an electronic component partially disposed in the first recess; and
solder that connects the metal pattern and the electronic component.

2. The semiconductor device according to claim 1, wherein
the first recess and the second recess have cross-sectional shapes expanding toward an opening of the first recess and an opening of the second recess, respectively.

3. The semiconductor device according to claim 1, further comprising a solder resist disposed on the metal pattern and having a planar shape surrounding the first recess and the second recess.

4. The semiconductor device according to claim 1, wherein
a part of the solder is disposed in the second recess.

5. The semiconductor device according to claim 1, wherein
the first recess and the second recess are separated from each other.

6. A power conversion apparatus comprising:
a main conversion circuit that includes the semiconductor device according to claim 1 and converts input power and outputs the converted power;
a drive circuit that outputs a drive signal for driving the semiconductor device to the semiconductor device; and
a control circuit that outputs a control signal for controlling the drive circuit to the drive circuit.

7. A moving body comprising the power conversion apparatus according to claim 6.

8. A method for producing a semiconductor device, the method comprising:
preparing an insulating substrate on which a metal pattern having a first recess and a second recess that are provided side by side is disposed;
fitting a part of an electronic component into the first recess;
fitting a part of a solder ball into the second recess;
forming solder that connects the metal pattern and the electronic component by melting the solder ball; and
disposing a semiconductor element on the insulating substrate.

* * * * *